United States Patent
Wendt et al.

[11] Patent Number: 5,500,385
[45] Date of Patent: Mar. 19, 1996

[54] METHOD FOR MANUFACTURING A SILICON CAPACITOR BY THINNING

[75] Inventors: Hermann Wendt, Grasbrunn; Josef Willer, Riemerling; Hans Reisinger, Gruenwald; Volker Lehmann, Munich, all of Germany

[73] Assignee: Siemens Aktiengesellschaft, Munich, Germany

[21] Appl. No.: 451,534

[22] Filed: May 26, 1995

[30] Foreign Application Priority Data

May 26, 1994 [DE] Germany .................. 44 18 430.1

[51] Int. Cl.$^6$ ............................ H01L 21/762
[52] U.S. Cl. ............................ 437/60
[58] Field of Search ............ 437/60, 919, 966, 437/974; 148/DIG. 14

[56] References Cited

U.S. PATENT DOCUMENTS

| | | | |
|---|---|---|---|
| 4,829,018 | 5/1989 | Wahlstrom | 437/974 |
| 5,256,587 | 10/1993 | Jun et al. | 437/60 |
| 5,286,670 | 2/1994 | Kang et al. | 437/974 |
| 5,302,540 | 4/1994 | Ko et al. | 437/60 |

FOREIGN PATENT DOCUMENTS 0528281  2/1993  European Pat. Off.

*Primary Examiner*—Chandra Chaudhari
*Attorney, Agent, or Firm*—Hill, Steadman & Simpson

[57] ABSTRACT

For manufacturing a silicon capacitor, hole openings are produced in an n-doped silicon substrate, a p$^+$-doped region is formed at the surface thereof and this surface is provided with a dielectric layer together with a conductive layer. The silicon substrate is thinned with an etching proceeding from the back side, this etching attacking silicon selectively to p$^+$-doped silicon and therefore stopping when the p$^+$-doped region is reached.

9 Claims, 2 Drawing Sheets

METHOD FOR MANUFACTURING A SILICON CAPACITOR BY THINNING

BACKGROUND OF THE INVENTION

1. Field of the Invention

The present invention is directed to a method for manufacturing a silicon capacitor.

2. Description of the Prior Art

European Patent Application 05 28 281 discloses a silicon capacitor. This known capacitor has an n-doped silicon substrate whose surface is structured in a characteristic way by electrochemical etching in a fluoride-containing, acidic electrolyte, the substrate being connected as the anode. During the electrochemical etching, hole structures that are more or less regularly arranged form at the surface of the substrate. These hole structures have aspect ratios into the range of 1:1000. The surface of the hole structures is provided with a dielectric layer and with a conductive layer. The conductive layer, dielectric layer and silicon substrate form a capacitor wherein specific capacitances up to 100 $\mu$FV/mm$^3$ are achieved. In order to increase the conductivity of the substrate, it is suggested in this European application that this be more highly n-doped.

SUMMARY OF THE INVENTION

An object of the present invention is to provide another method for the manufacture of a silicon capacitor that is optimized with respect to the integration of the silicon capacitor in a housing.

The above object is achieved in the inventive method, wherein a p$^+$-doped region is generated along a first principal surface of the n-doped substrate in which hole openings have been formed by electrochemical etching. After application of a dielectric layer and an electrically conductive layer onto the surface of the hole openings, the silicon substrate is thinned proceeding from a second principal surface lying opposite the first. An etching is thereby utilized that attacks silicon selectively relative to p$^+$-doped silicon. This etching therefore stops as soon as the surface of the p$^+$-doped region is uncovered.

A thinning of the silicon substrate to 200 $\mu$m is required for integration of a silicon capacitor into the type of housing that is usually employed, especially an SMD housing, given a silicon substrate initially having a standard thickness of 500 $\mu$m. In the inventive method, the thickness of the remaining silicon substrate achieved after the thinning is set by means of the depth of the hole openings and the doping depth of the p$^+$-doped region. Since the etching stops at the p$^+$-doped region, the n-doped silicon of the part of the substrate to be removed can be completely removed in the inventive method without having to be concerned that the hole openings will be etched free.

Conventionally, silicon substrates having semiconductor components are usually ground thin proceeding from the back side before integration of the semiconductor components into a housing. The remaining thickness of the substrate is determined by the grinding process. The material thickness that is removed in the thin-grinding is exact to about only 20 $\mu$m given the grinding processes that are usually employed. The risk of uncovering the hole openings and, thus, the risk of failure of the component would thus be present in the case of a conventionally manufactured silicon capacitor. Too little thin-grinding, by contrast, would not allow the highly p-doped region to be directly connected to the backside metallization.

A further advantage of the inventive method is that the surface of the p$^+$-doped region is uncovered. A low-impedance contact can be directly applied thereon without a further doping of the silicon being required for reducing the series resistance.

In order to keep the time required for the etching for thinning the silicon substrate within reasonable limits in an embodiment of the invention, the silicon substrate can first be thinned by removing a predetermined thickness by grinding proceeding from the second principal surface. The etching selective to p$^+$-doped silicon with which the ultimate thickness of the silicon capacitor is defined is then implemented. The predetermined thickness that is removed by the thin-grinding is set such that the grinding process is ended at a safe distance from the p$^+$-doped region.

The p$^+$-doped region is preferably produced by gas diffusion with diborane (B$_2$H$_6$), whereby a dopant concentration greater than or equal to $10^{19}$cm$^{-3}$ is set in the p$^+$-doped region. A dopant depth of 1 $\mu$m can be achieved with this method after a diffusion time of about 5 hours at 1050° C.

The etching selective to p$^+$-doped silicon for thinning the silicon substrate is preferably implemented with a KOH solution at (60±2)° C. and having (10±2) weight percent KOH. The selective etching can ensue with KOH solutions having different concentrations and temperatures, with NaOH solutions having different concentrations and temperatures, with ethylenediamine solutions having different concentrations and temperatures, for example 70 weight percent and 80° C., as well as with other basis etchants.

DESCRIPTION OF THE EMBODIMENTS

The invention shall be set forth in greater detail below with reference to an exemplary embodiment with the following figures showing a sequence in the production of a silicon capacitor in accordance with the inventive method.

DESCRIPTION OF THE PREFERRED EMBODIMENTS

Figure 1:
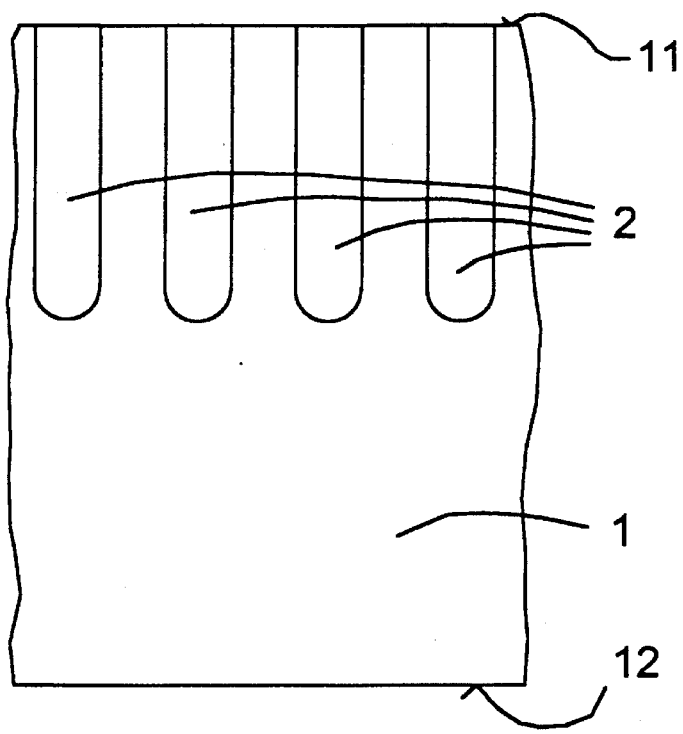
FIG. 1 shows a silicon substrate with hole openings.

A silicon substrate 1 of n-doped, single-crystal silicon having a specific resistance of 5 Ohms·cm is provided with a plurality of hole openings 2 by electrochemical etching at a first principal surface 11 (see FIG. 1 ).

To that end, the first principal surface 11 is brought into contact with an electrolyte. For example, a 6 weight percent hydrofluoric acid (HF) solution is employed as the electrolyte. The silicon substrate 1, as the anode, is charged with a potential of 3 volts. The silicon substrate 1 is illuminated proceeding from a second principal surface 12 opposite the first principal surface 11. A current density of 10 mA/cm$^2$ is thereby set. In the electrochemical etching, minority charge carriers move in the n-doped silicon to the first principal surface 11 that is in contact with the electrolyte. A space charge zone is formed at the first principal surface 11. Since the field strength is higher in the region of depressions in the first principal surface 11 than outside of these depressions, the minority charge carriers move to these points in preferred fashion. A structuring of the first principal surface 11 arises as a result. As an initially small irregularity becomes deeper, an increasing amount of minority charge carriers move thereto thereby making this initially small irregularity even deeper as the etching proceeds and the etching attack at this point becomes even greater.

The hole openings 2 begin to grow proceeding from irregularities in the first principal surface 11 that are present in a statistical distribution in every surface. In order to achieve a uniform distribution of the hole openings 2, it is advantageous to intentionally provide the first principal surface 11 with irregularities before the electrochemical etching, these each acting as a nucleus (seed) for the etching attack in the following electrochemical etching.

After an etching time of approximately 180 minutes, the hole openings 2 have a diameter in the range of 0.5 through 10 μm, preferably 2 μm, given a depth in the range of 50 through 300 μm, preferably 175 μm, and an aspect ratio in the range of about 1:25 through 1:1000.

Subsequently, the silicon substrate 1 is thoroughly rinsed with water.

Figure 2:
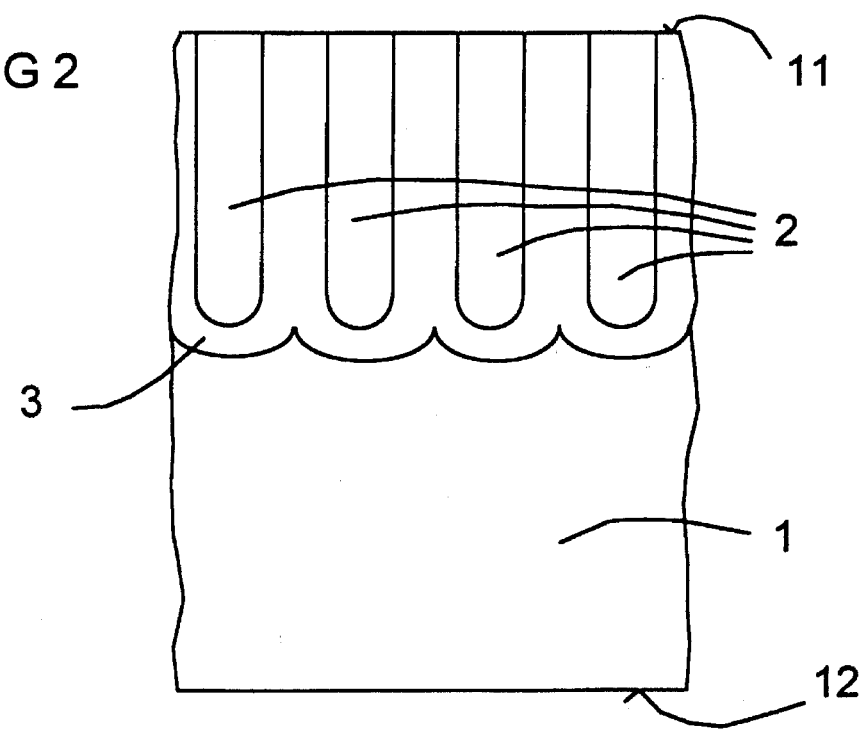
FIG. 2 shows the silicon substrate after formation of a p$^+$-doped region at the surface of the hole openings.

Subsequently, a $p^+$-doped region 3 is generated along the surface of the hole openings 2, for example by vapor phase diffusion of boron (see FIG. 2). The $p^+$-doped region 3 has a dopant concentration in the range of $10^{19}$ through $10^{21}$ cm$^3$. The $p^+$-doped region 3 is manufactured with a doping depth of approximately 1 μm. In the formation of the $p^+$-doped region 3, the diffusion time amounts to 5 hours given an oven temperature of 1050° C.

After this, a dielectric layer 4 is applied onto the surface of the hole openings 2. The dielectric layer 4 is produced, for example, by combined application of $SiO_2$, $Si_3N_4$ and $SiO_2$ again and has a thickness of, for example, 60 nm. Alternatively, the dielectric layer 4 can be formed by anodic oxidation or thermal oxidation. The formation of the dielectric layer 4 by combined application of $SiO_2$, $Si_3N_4$ and $SiO_2$, however, is preferred because it results in a lower defect density of the dielectric layer 4 compared to the other techniques, this being required for the silicon capacitor.

Figure 3:
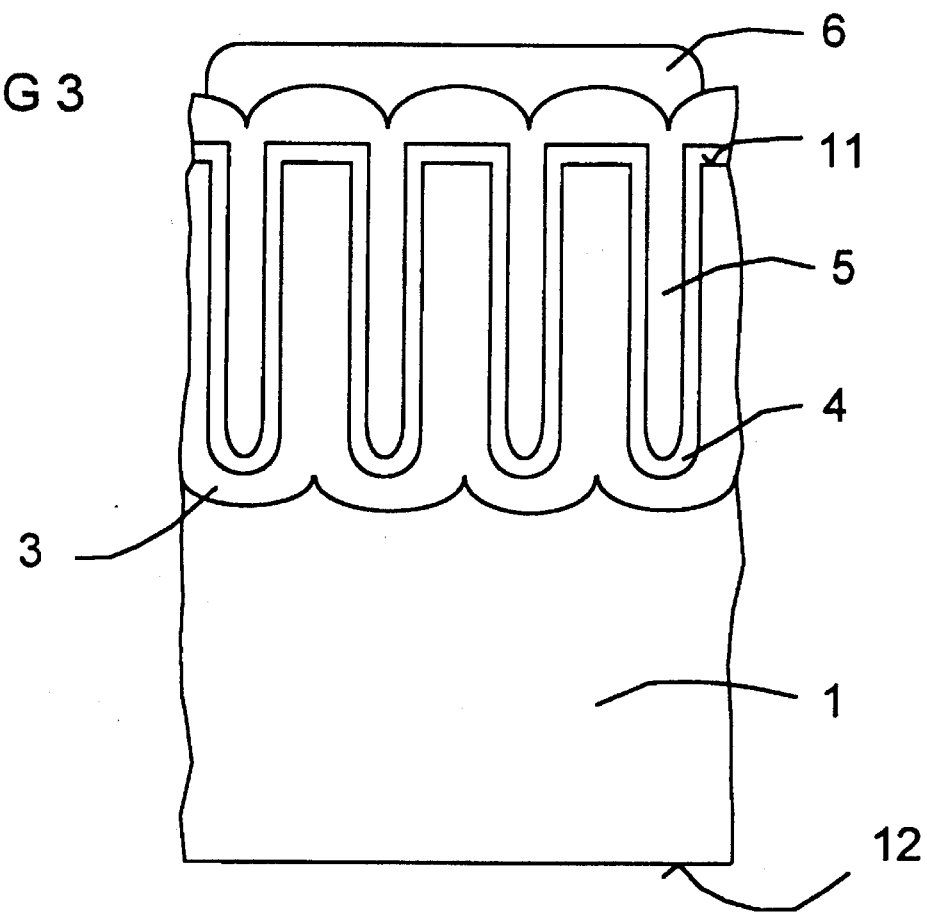
FIG. 3 shows the silicon substrate after deposition of a dielectric layer and of a conductive layer and formation of a contact to the conductive layer.

An electrically conductive layer 5 of, for example, n-doped polysilicon is applied onto the surface of the dielectric layer 4. The conductive layer 5 can completely fill the remaining clearance in the hole openings 2. A first contact of, for example, aluminum is deposited on the surface of the conductive layer 5 (see FIG. 3).

Figure 4:
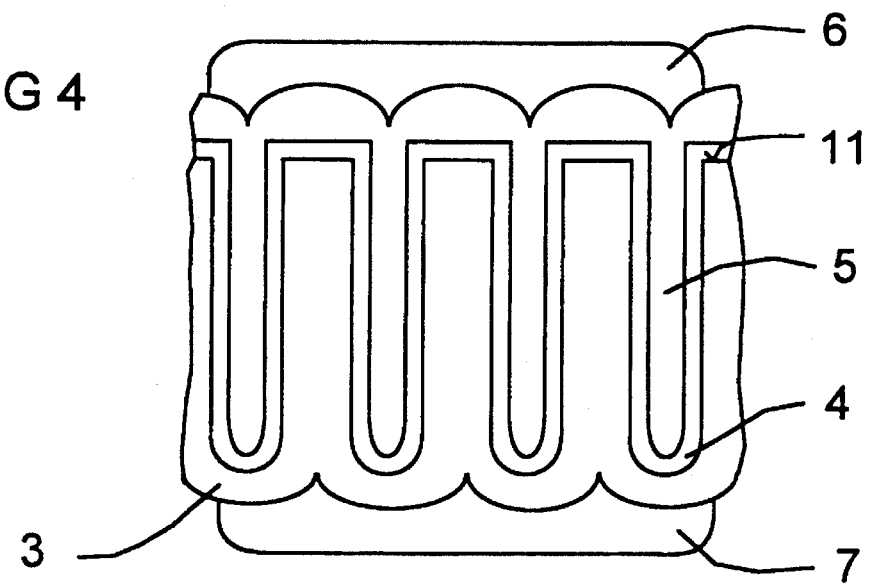
FIG. 4 shows the thinned silicon substrate after an etching selective to p$^+$-doped silicon.

Subsequently, the substrate 1 is initially thinned by thin-grinding to a thickness of about 200 μm proceeding from the second principal surface 12. The remaining n-doped silicon of the silicon substrate 1 is removed in an etching selective to $p^+$-doped silicon with, for example, a KOH solution of 10 weight percent KOH at 60° C. This etching attacks undoped and n-doped silicon, but does not attack $p^+$-doped silicon. This results in the etching process being stopped as soon as a surface of p-doped silicon having a dopant concentration or more then/equal to $10^{19}$ cm$^{-3}$ has been reached. In the inventive method, the etching therefore stops as soon as the surface of the $p^+$-doped region 3 is uncovered proceeding from the second principal face (see FIG. 4). N-doped silicon, which is the initial material of the silicon substrate 1, is completely removed. Only the $p^+$-doped region 3 remains. A second contact of, for example, 1 μm thick gold is applied on the exposed surface of the $p^+$-doped region 3. Oriented perpendicularly to the first principal surface 11, the silicon capacitor formed of fist contact 6, conductive layer 5, dielectric layer 4, $p^+$-doped region 3 and second contact 7 has a dimension of 180 μm. The area of the silicon capacitor amounts, for example, to 0.9×0.9 mm$^2$. It can therefore be built into a commonly employed housing, for example an SMD housing.

A plurality of silicon capacitors can be manufactured on the substrate 1, these being separated before being built into their respective housings.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for manufacturing a silicon capacitor comprising the steps of:

producing a plurality of hole openings on a first principal surface of an n-doped silicon substrate by electrochemical etching, said hole openings defining a hole opening surface;

generating a $p^+$-doped region along said hole opening surface;

applying a dielectric layer on said hole opening surface;

applying an electrically conductive layer on said dielectric layer;

thinning said silicon substrate by etching proceeding from a second principal surface of said silicon substrate, opposite said first principal surface, with an etchant which attacks silicon selectively relative to $p^+$-doped silicon and said etching stopping at a surface of said $p^+$-doped region; and attaching respective electrical contracts to said $p^+$-doped region and to said electrically conductive layer.

2. A method as claimed in claim 1 wherein the step of generating said $p^+$-doped region comprises generating said $p^+$-doped region by vapor phase diffusion with diborane to produce a $p^+$-dopant concentration greater than or equal to $10^{19}$cm$^{-3}$ in said silicon substrate.

3. A method as claimed in claim 1 wherein the step of thinning said silicon substrate by etching comprises thinning said silicon substrate by etching using an etching solution with an etchant selected from the group consisting of KOH, NaOH and ethylenediamine.

4. A method as claimed in claim 1 wherein the step of thinning said silicon substrate by etching comprises etching said silicon substrate until said surface of said $p^+$-doped region is exposed proceeding from said second principal surface; and wherein the step of providing said electrical contact for said $p^+$-doped region comprises providing said $p^+$-doped region with said electrical contact proceeding from said second principal.

5. A method as claimed in claim 4 wherein the step of generating said $p^+$-doped region comprises generating said $p^+$-doped region with a doping depth in said silicon substrate in a range between 0.5 and 1.5 μm.

6. A method as claimed in claim 1 wherein the step of forming said hole openings by electrochemical etching comprises bringing a fluoride-containing acidic electrolyte into contact with said first principal surface and generating a voltage between said electrolyte and said silicon substrate with said silicon substrate connected as an anode, and illuminating said second principal surface of said silicon substrate during said electrochemical etching.

7. A method as claimed in claim 6 wherein the step of forming said hole openings by electrochemical etching comprises forming hole openings having respective diameters in a range from 0.5 through 10 μm and respective depths in a range from 50 through 300 μm, and having respective aspect ratios in a range of approximately 1:25 through 1:1000.

8. A method as claimed in claim 1 wherein the step of applying a dielectric layer comprises forming a dielectric layer on said hole opening surface comprised of a multiple layer sequence $SiO_2/Si_3N_4/SiO_2$.

9. A method as claimed in claim 1 wherein the step of applying said electrically conductive layer comprises applying an electrically conductive layer on said dielectric layer by vapor phase deposition of doped polysilicon.

* * * * *